United States Patent [19]
Müller

[11] Patent Number: 5,214,397
[45] Date of Patent: May 25, 1993

[54] MODULATOR USING LOW-PASS FILTER AS DELAY ELEMENT

[75] Inventor: Fred-Egon Müller, Pforzheim, Fed. Rep. of Germany

[73] Assignee: Alcatel N.V., Amsterdam, Netherlands

[21] Appl. No.: 756,183

[22] Filed: Sep. 6, 1991

[30] Foreign Application Priority Data

Sep. 7, 1990 [DE] Fed. Rep. of Germany ....... 4028371

[51] Int. Cl.$^5$ .................. H03C 1/14; H03C 1/58; H04L 27/20
[52] U.S. Cl. .................. 332/105; 332/152; 332/164; 332/168; 332/172; 332/177; 375/39; 375/43; 375/61; 455/46; 455/109; 455/327; 455/330; 455/332
[58] Field of Search ............ 332/103–105, 332/151, 152, 167–169, 172, 177, 178; 455/46, 109, 326, 327, 330, 332; 375/39, 43, 61

[56] References Cited

U.S. PATENT DOCUMENTS

| | | | |
|---|---|---|---|
| 4,249,263 | 2/1981 | Shinkawa et al. | 455/327 |
| 4,528,526 | 7/1985 | McBiles | 332/105 |
| 4,607,394 | 8/1986 | Nightingale | 455/327 |
| 4,612,518 | 9/1986 | Gans et al. | 332/105 |

FOREIGN PATENT DOCUMENTS 2944642 5/1980 Fed. Rep. of Germany.

Primary Examiner—Siegfried H. Grimm
Attorney, Agent, or Firm—Christie, Parker & Hale

[57] ABSTRACT

A push-pull modulator stage 70 has two possible transmission paths, an electrically short path (7) and a phase delay path (6) with a phase delay element providing a phase shift of approximately 180°. The phase delay element has the form of a low pass filter. In each of the two paths (6, 7) a semiconductor diode ($D_1$, $D_2$) is disposed in such a way that they sense the carrier ($U_c$) with a phase shift of 180° and, correspondingly, switch in unison if no modulation voltage ($U_m$) is present, thus suppressing the carrier at the signal output (3). When a modulation signal ($U_m$) is present, the push-pull balance is disturbed and the resistance of one of the two paths (6) becomes lower relative to the other path (7), which leads to the generation of the modulated carrier voltage (Umc). The modulator stage (70) can also be designed as a dual modulator stage and/or can be used as a mixer stage.

10 Claims, 4 Drawing Sheets

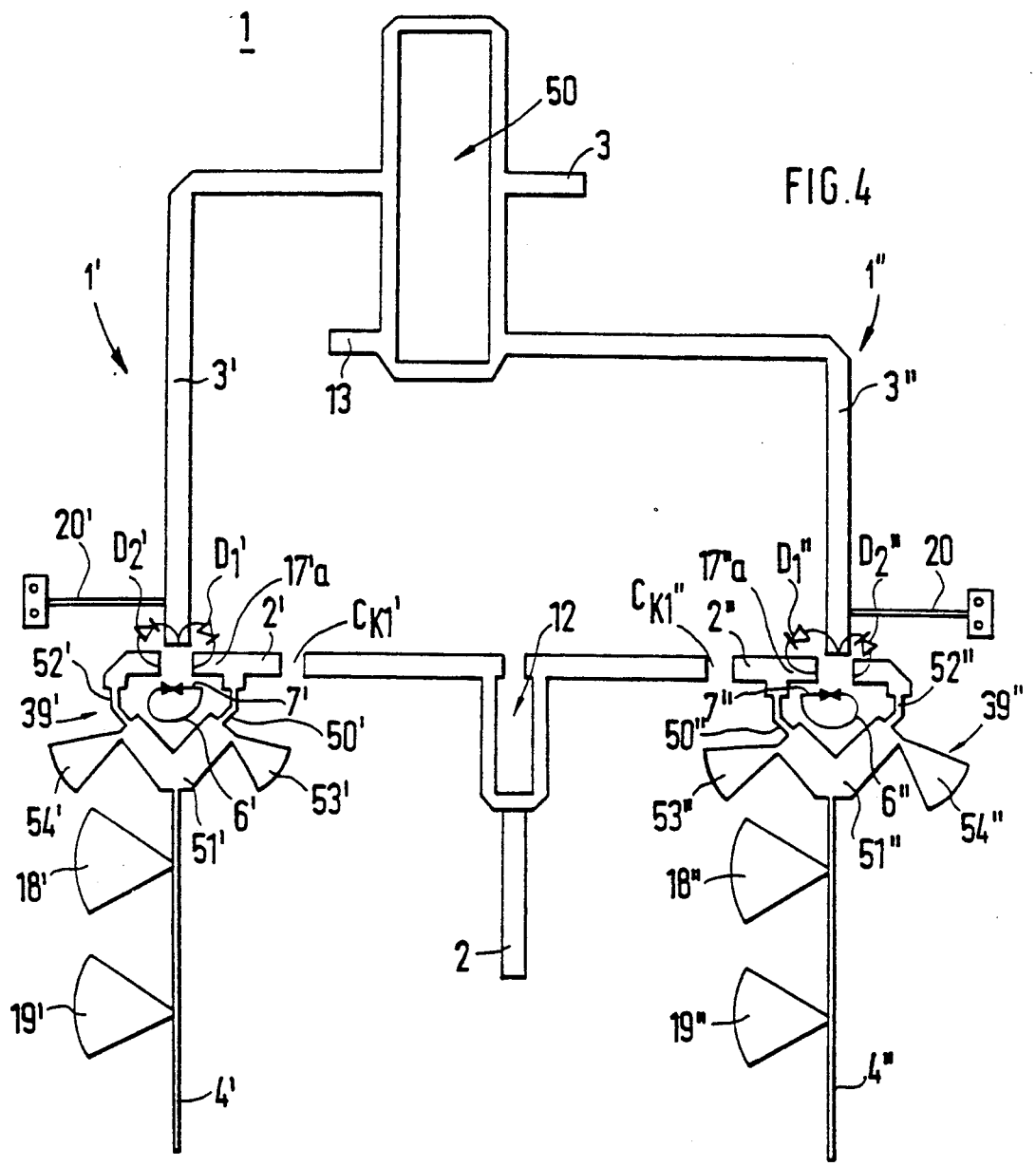

MODULATOR USING LOW-PASS FILTER AS DELAY ELEMENT

TECHNICAL FIELD

The invention relates to a modulator stage which may also be used as a mixing stage.

BACKGROUND ART

For transmission of digital data, the signals are modulated on a carrier by means of a modulator. A known principle for a direct modulator used in transmission has carrier and signal inputs and a signal output interconnected as follows. The carrier input and the signal output are connected by two paths, one of which contains a phase delay element. Furthermore, each of the two paths contains a non-linear semiconductor component arranged in such a way that the non-linear semiconductor components, by virtue of their polarity and the arrangement of the phase delay element, which provides a phase delay of 180°, are switched in unison with reference to the carrier, such that the carrier is extinguished at the signal output. If a signal in the form of a modulation voltage is introduced into the delay path, the two non-linear semiconductor elements will be switched in push-pull fashion with reference to the modulation voltage, which causes the modulation of the carrier at the signal output. Such a modulator can also be used as a mixing stage. A particular structure of a modulator working on the principle described above, and its use as a mixer, is described in the German Patent Document 29 44 642, which generally corresponds to U.S. Pat. No. 4,249,263 hereby incorporated by reference. The phase delay element of the described modulator consists of a piece of conductive material having the length $\lambda/2$ of the midfrequency of the carrier.

Because of the rigidly defined length of the phase delay element, the known amplitude modulator teaches only a predetermined length, namely $\lambda/2$ of the carrier.

DISCLOSURE OF INVENTION

The objective of the invention is to create a modulator stage in which the length and shape of the phase delay element is readily adaptable, geometrically and electrically, to the remainder of the modulator circuit.

This objective is achieved by implementing the phase delay element as a low-pass filter.

A specific advantage of the invention is that the parasitic components can also be considered in the design of the low pass filter.

Additional embodiments of the invention can be found in the following description.

BRIEF DESCRIPTION OF DRAWINGS

The detailed description of the invention proceeds on the basis of FIGS. 1 through 6 relating to exemplary embodiments of modulator stages. Use as a mixing stage is explained at the end of the description. The Figures show.

Figure 1:
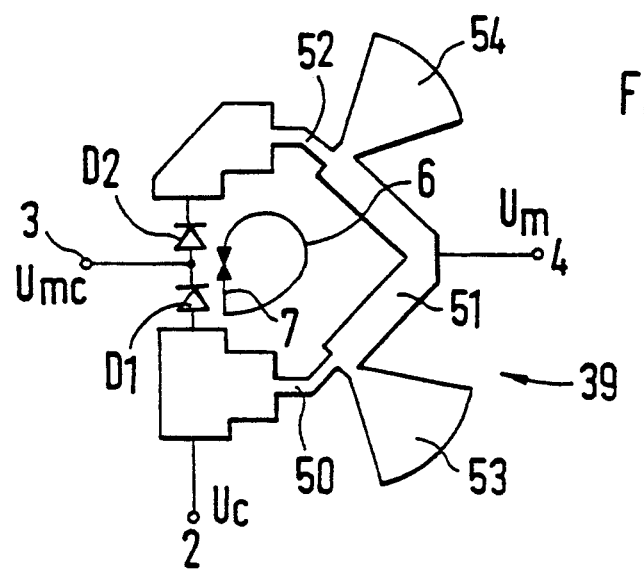
FIG. 1, a first embodiment of a modulator stage according to the invention.

The modulator stage 70 shown in FIG. 1 is implemented in planar strip conductor technology and has a carrier input 2, a signal input 4, and a signal output 3. The carrier with the voltage $U_c$ is present at the carrier input 2, the modulated carrier with the voltage $U_{mc}$ at the signal output 3, and a digital signal with the modulation voltage $U_m$ at the signal input 4. From the carrier input 2 to the signal output 3 of the modulator stage 70, there are two paths, an electrically short path 7 and a phase delay path 6, the latter containing a phase delay element which causes the phase of the carrier $U_c$ to shift, ideally by 180° or by an odd integer multiple of 180°. From the carrier input, the same power at the same phase is applied to each of the two paths. Each of the two paths contains a semiconductor diode $D_1$, $D_2$ of opposite polarity with reference to the signal output 3.

The semiconductor diode $D_2$ in the phase delay path 7 is placed after the phase delay member with respect to the direction of propagation of the carrier, so that both semiconductor diodes $D_1$ and $D_2$ operate in unison relative to the carrier. In the previously described part of the modulator stage 70, ideally, due to the disposition of the semiconductor diodes $D_1$ and $D_2$ and the design of the two paths 6, 7, a suppression of the carrier voltage prevails at the signal output 3, since the circuit acts as a bridge. In reality, optimization of the carrier voltage suppression is required. To that end, the modulator stage 70 has, for setting the balance of the unmodulated state, an adjustable resistor $R_R$ applied to the potential $U_g$ and connected with the signal input 4 (not illustrated).

Connected with the phase delay path 6 is the signal input 4, to which is applied the modulation voltage $U_m$ which causes the two semiconductor diodes $D_1$ and $D_2$ to conduct in push-pull fashion. How such a result may be obtained will now be further explained in the description of the specific embodiments.

As shown in FIG. 4, the signal input 4 is equipped with a low-pass filter 18, 19, and the signal output 3 with a high-pass filter 20.

When a modulation voltage $U_m$ with an amplitude of a magnitude sufficient to control the semiconductor diodes $D_1$ and $D_2$ is applied to the signal input 4, the semiconductor diode $D_1$ is blocked and the other semiconductor diode $D_2$ is unblocked, whereby the full carrier voltage $U_c$ is applied to the signal output 3. If the polarity of $U_m$ is changed, the polarity of $U_{mc}$ changes also, which may be regarded as a reversal in phase.

In order to achieve amplitude linearity, lower modulation voltages $U_m$ are applied to the signal input 4, whereby one of the semiconductor diodes, e.g., $D_1$ is less conductive than the other semiconductor diode, e.g., $D_2$. The balance point is thus merely shifted at the signal output 3, thus generating a resultant modulated carrier voltage $U_{mc}$.

The magnitude of the modulated carrier voltage $U_{mc}$ depends on the magnitude of the modulation voltage $U_m$, and its phase depends on the sign of the modulation voltage $U_m$. When, for example, a positive modulation voltage $U_m$ is applied to the signal input 4, the semiconductor diode $D_1$ is more conductive than the semiconductor diode $D_2$, whereby the electrically short path 7 is of a lower impedance than the phase delay path 6, and the transmission over the electrically short path 7 dominates. If the modulation voltage has a negative amplitude, the situation is exactly the opposite.

Figure 2:
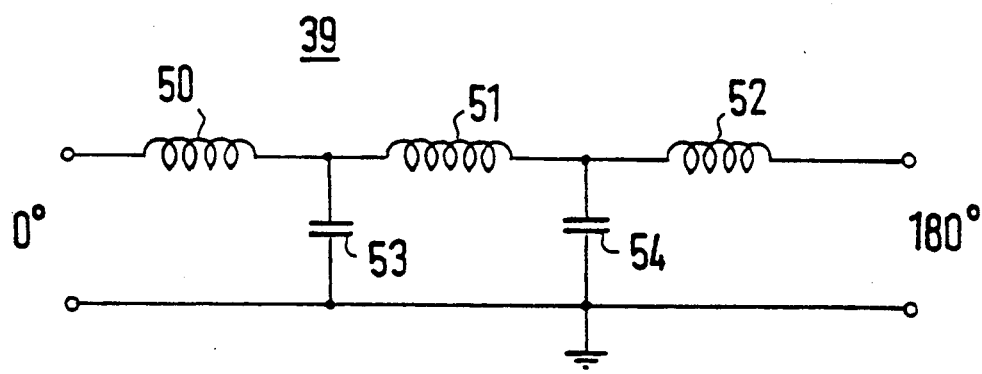
FIG. 2, the schematic representation of the delay element from FIG. 1.

The phase delay element is, according to the invention, constructed as a low-pass filter 39. The low-pass filter 39 shown in FIG. 1 consists of three inductances 50, 51, 52, connected in series and two capacitances 53, 54, each applied between a respective pair of inductances and coupled to ground potential, as shown in the equivalent circuit of FIG. 2.

In the design of the low-pass filter 39 shown in FIG. 1, the number of inductances 50, 51, 52 and the number of capacitances 53, 54, as well as the design of the inductances, are not mandatory.

For a carrier frequency from 1 to 10 GHz, the above described low-pass filter has proven advantageous. In that regard, a frequency limit $f_G$ on the order of the second harmonic of the carrier frequency is especially advantageous.

The above described five-stage low-pass filter 39 has a further specific advantage: on the one hand, the frequency dependance of the low-pass filter is relatively slight due to the small number of the components, while on the other hand, the flexibility of the geometrical design allows sufficient leeway to enable the electrically short path 7 and the phase delay path 6 with the low-pass filter 39 to be coupled to one another.

For modulator circuits produced with planar strip conductor technology, geometric reasons make it advantageous to design both ends of the low-pass filter as the inductances 50 and 52.

If the circuit design of the modulator stage is carried out in the planar strip conductor technology, the dimensioning of the circuit is performed with computer assistance (computer aided design: CAD). In that case, it is readily apparent that parasitic circuit components as well as production tolerances can also be included in the calculation.

The circuit layout is also suitable for production in MMIC technology (monolithic microwave integrated circuit). In that case, the exemplary embodiments must be modified to be compatible with the technology.

Since, in reality, the electrically short path 7 and the phase delay path 6 have dissimilarities besides the phase delay element, the low-pass filter will have to be dimensioned to produce a delay in the phase delay path 6 of 180° compared with the electrically short path. Only in an ideal case does the phase delay result exclusively from the low-pass filter 39.

The low-pass filter may also be constructed with discrete components, which would be preferable for carrier frequencies in the upper MHz range.

The described modulator stage 70 thus constitutes a simple phase commutator operating in the transmission mode, which functions as a part of a digital direct modulator.

In the implementation of such a modulator stage 70, it is easy to visualize that the bridge balance required for carrier suppression, as well as the amplitude linearity can be disturbed, e.g., by dissimilarity of the semiconductor diodes and their parasitic components, which leads to a deviation from the ideal behavior of the modulator stage 70. Furthermore, the transmission occurs in one case via the electrically short path 7, in the other via the phase delay path 6. Since the two paths are dissimilar both in design and electrically, the group delay time in both is also dissimilar, leading to high frequency dependencies which must be compensated by additional measures.

These problems have been solved by the exemplary embodiments described below.

Figure 3:
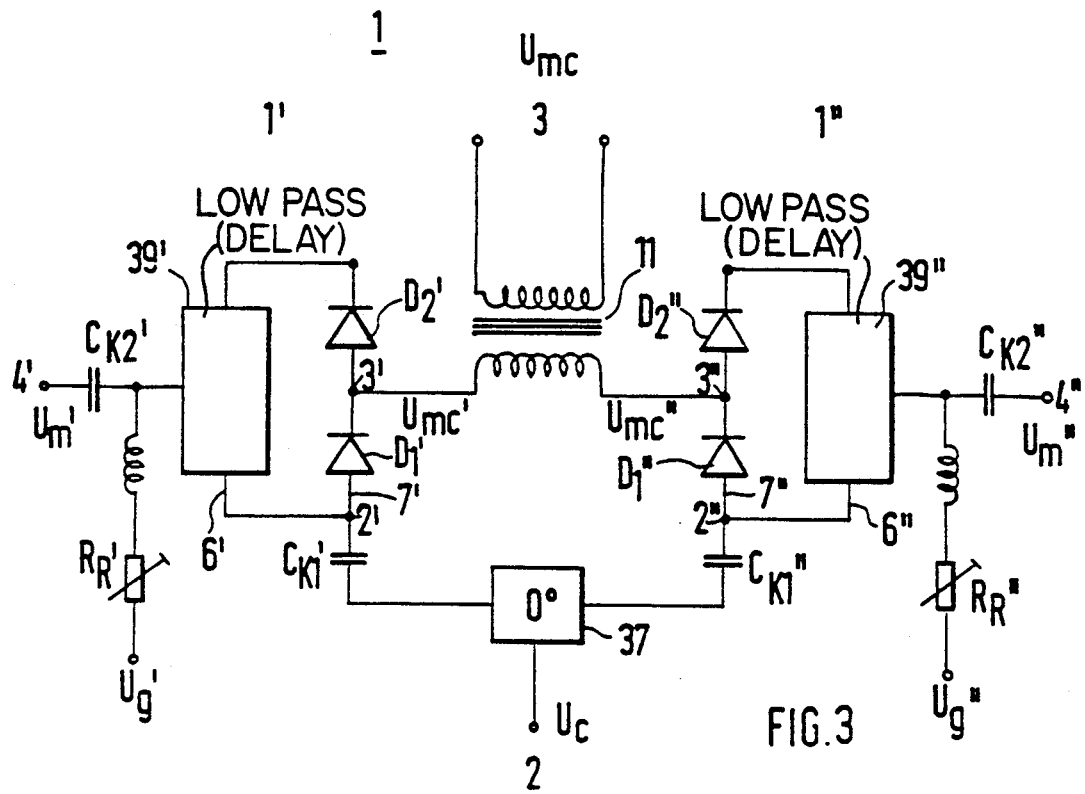
FIG. 3, a schematic representation of the dual modulator stage according to the invention, FIG. 4, a second embodiment in the form of a double modulator stage designed in microchip technology for high carrier frequencies, FIG. 5, a third embodiment of a double modulator stage constructed with discrete elements, for low frequencies, and FIG. 6, a schematic representation of a 16 QAM modulator.

The problem of carrier suppression without an applied modulation voltage $U_m$ is solved in accordance with one aspect of the invention by means of the regulable resistor $R_R'$, in accordance with another aspect by the symmetrical layout of a modulator stage 70 as the described below double modulator stage 1, depicted in FIG. 3.

The double modulator stage 1 consists of two identical modulator stages 1' and 1", constructed, in principle, like the modulator stage 70 and interconnected as follows. Equivalent components of the modulator stages are identified with the same reference signs. If the reference sign of a feature is marked with ', this feature belongs to the modulator stage 1', if the reference sign of a feature is marked with ", the feature belongs to the modulator stage 1". The two carrier inputs 2', 2" are combined into a common carrier input 2 of the dual modulator stage 1 by means of a 0° power splitter 37, and are galvanically decoupled by the capacitors $C_{K1}'$, $C_{K1}''$. The two signal outputs 3', 3" are brought together in a power combiner, e.g. a transformer 11, whose secondary winding produces the output 3 of the push-pull modulator stage 1. The two signal inputs 4', 4" are supplied with the same modulating signal with a signal inverter (not shown) provided before one of the two signal inputs 4' or 4", which serves to provide each of the two signal inputs with a modulation voltage $U_m$ of the same amplitude and opposite sign.

The carrier input 2 of the dual modulator stage 1 is coupled to the transformer 11 and the signal output 3 in accordance with the amplitude of the modulation voltage $U_m'$; for instance, with a positive modulation voltage $U_m$ at the signal input 4' and a negative modulation voltage $U_m$ at the signal input 4", via the electrically short path 7' of the partial modulator stage 1' and via the phase delay path 6" of the partial modulator stage 1". With opposite signs of the modulation voltage $U_m$ applied to the signal inputs 4', 4", the connection occurs via the phase delay path 6' of the partial modulator stage 1' and the electrically short path 7" of the partial modulator stage 1".

In any case, the transmission must always occur via both an electrically short path 7', 7" and a phase delay path 6', 6". In this manner technical inadequacies of the partial modulator stages 1', 1" are compensated for, the group delay times in each switching condition are approximately equal, and the dual modulator stage 1 is temperature stable over a wide range and, within the range of carrier frequencies utilized for directional radio transmissions, is amplitude linear and frequency independent.

A second exemplary embodiment, a dual modulator stage 1, is depicted in FIG. 4. It has the same functional elements as the dual modulator stage 1 depicted in FIG. 3, but is designed in planar microstrip technology specifically for a carrier $U_c$ with a frequency in the gigahertz range and for a modulation voltage $U_m$ with a frequency in the megahertz range. The arrangement of the functional elements corresponds to that in FIG. 3. The corresponding functional elements are provided with the same reference symbols as in FIG. 3.

The dual modulator stage 1 has two partial modulator stages 1', 1" with a common carrier input 2 and a common signal output 3. The carrier voltage $U_c$ is applied to the carrier input 2', 2" of the two partial modulator stages 1', 1" via a so-called Wilkinson coupler 12. The two carrier inputs 2', 2" are each galvanically isolated by the capacitors $C_{K1}'$, $C_{K1}"$ from the Wilkinson coupler 12', 12". The signal outputs 3', 3" are combined via a 180° power combiner 50 in the form of a so-called "rat race ring".

The rat race ring has the two signal outputs 3', 3" of the partial modulator stages 1', 1" as its input, the output 3 of the dual modulator stage 1 as its output, and a 50 ohm connection 13 to ground. The latter results in an additional 180° phase shift of the modulated carrier voltage $U_{mc}'$ exiting from the partial modulator stage 1' relative to the carrier voltage $U_{mc}"$, thus bringing the two into proper phase relation.

Both partial modulator stages 1', 1" are similar in structure to the modulator stage 70, with the partial modulator stage 1' being the mirror image of the partial modulator stage 1".

The second embodiment is constructed in the planar microstrip technology and is equipped with the diodes $D_1'$, $D_1"$, $D_2'$, $D_2"$.

Figure 5:
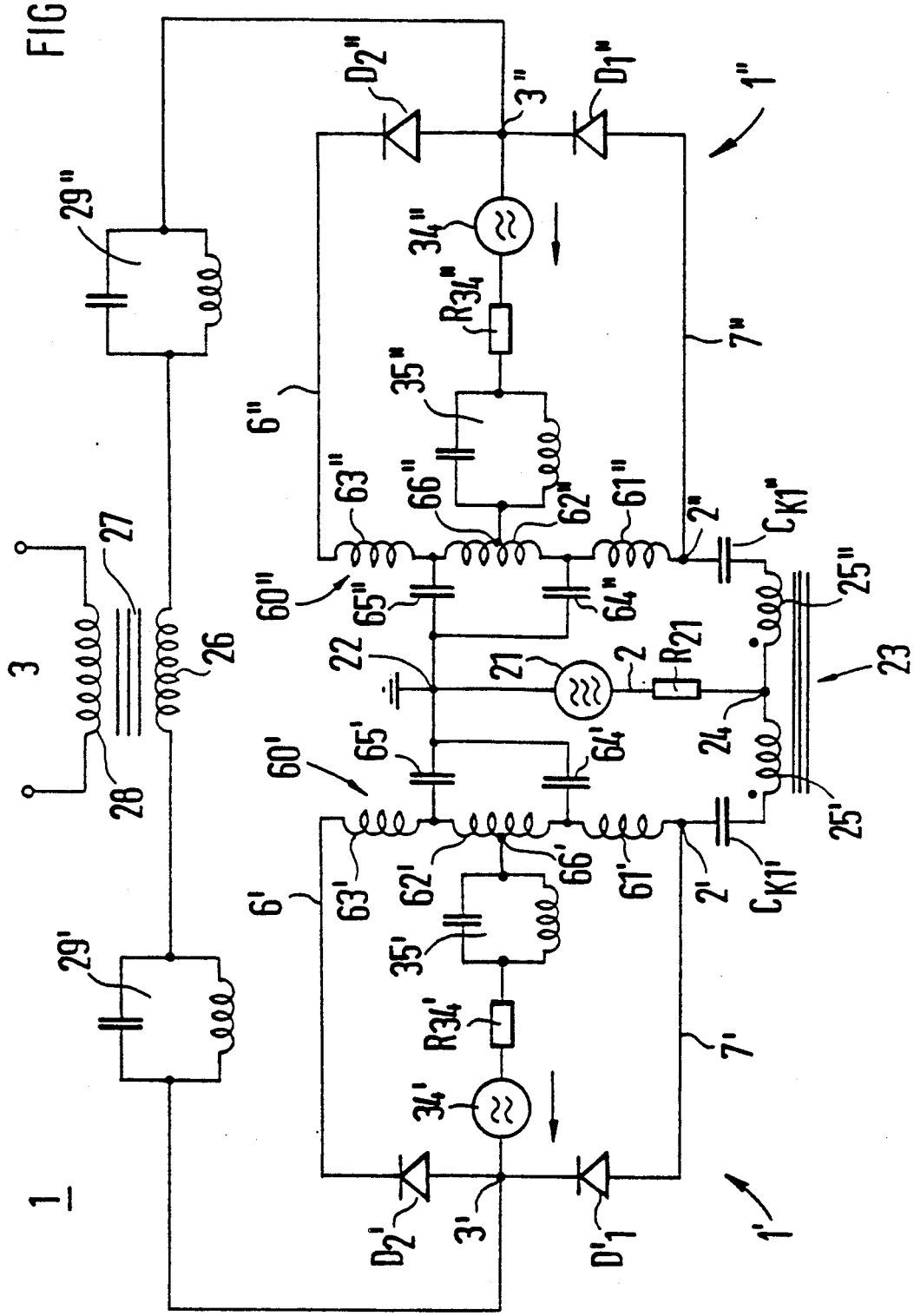

A third embodiment is shown in FIG. 5. The depicted dual modulator stage 1, as well as the dual modulator stage shown in FIG. 4, both include the same functional elements as the one shown in FIG. 3. Corresponding features are, therefore, provided with the same reference signs. It is designed specifically for a carrier $U_c$ with a wavelength in the upper megahertz range and a correspondingly lower frequency of the modulating signal $U_m$.

The dual modulator stage 1 has two partial modulator stages 1', 1" with a common signal output 3. The carrier $U_c$ is generated in the oscillator 21, whose one side is connected to the ground 22, while the other is connected to the carrier inputs 2', 2". An autotransformer 23 is incorporated between the oscillator 21 and the carrier inputs 2' and 2". The oscillator 21 is connected to the tap 24, and the two winding ends 25' and 25" are connected via the coupling capacitors $C_{K1}'$ and $C_{K1}"$ to the carrier inputs 2', 2". The autotransformer 23 constitutes a 0° powersplitter, and the resistor $R_{21}$ represents the internal resistance of the oscillator 21.

The signal outputs 3', 3" are connected to the two ends of the primary winding 26 of a transformer 27 which serves the same function as transformer 11. The ends of the secondary winding 28 constitute the signal output 3 of the dual modulator stage 1. For the suppression of the modulation voltage $U_m$ at the signal output 3, high impedance parallel resonant circuits 29', 29" for the modulating signal $U_m$ are provided between the ends of the primary winding 26 and the signal outputs 3', 3".

Each of the two partial modulator stages 1', 1" contains a phase delay path 6', 6" and an electrically short path 7', 7". The phase delay path 6', 6" has a low pass filter 60', 60" and a semiconductor diode $D_2'$, $D_2"$. The low pass filter 60', 60" is constructed of discrete elements and consists of three inductances connected in series 61', 61"; 62', 62"; 63', 63" and two respective capacitances 64', 64"; 65', 65" located between adjacent inductances and coupled to ground. The middle inductance 62', 62" has a tap for inputting the modulation signal $U_m'$, $U_m"$. The electrically short path 7', 7" contains a semiconductor diode $D_1'$, $D_1"$. The polarity of the diodes corresponds to that of the previous embodiments.

Between the signal output 3', 3" and the tap 66', 66", the modulation signal is generated in an oscillator 34', 34" which is directly connected to the output 3', 3" and is connected via a parallel resonant circuit 35', 35" to the tap 66', 66". The resistances $R_{34}'$, $R_{34}"$ represent the internal resistances of oscillators 34', 34". The parallel resonant circuit 35', 35" presents a high impedance to the carrier $U_c$.

The low pass filter 60', 60" and the two semiconductor diodes $D_1'$, $D_2'$; $D_1"$, $D_2"$ act as a Wheatstone bridge maintaining a balance between the output 3', 3" and the tap 66', 66", as long as no modulation voltage $U_m$ is applied. If, however, a modulation voltage $U_m$ is applied, the bridge balance is cancelled and the modulated carrier voltage $U_{mc}$ appears at the output 3', 3".

Especially when designing a modulator stage in the form of a dual modulator stage, the use of a low pass filter 39', 39"; 60', 60" for the phase delay element is particularly advantageous, since, when incorporated into such a relatively complex circuit, it provides considerable flexibility in arrangement and configuration.

Figure 6:
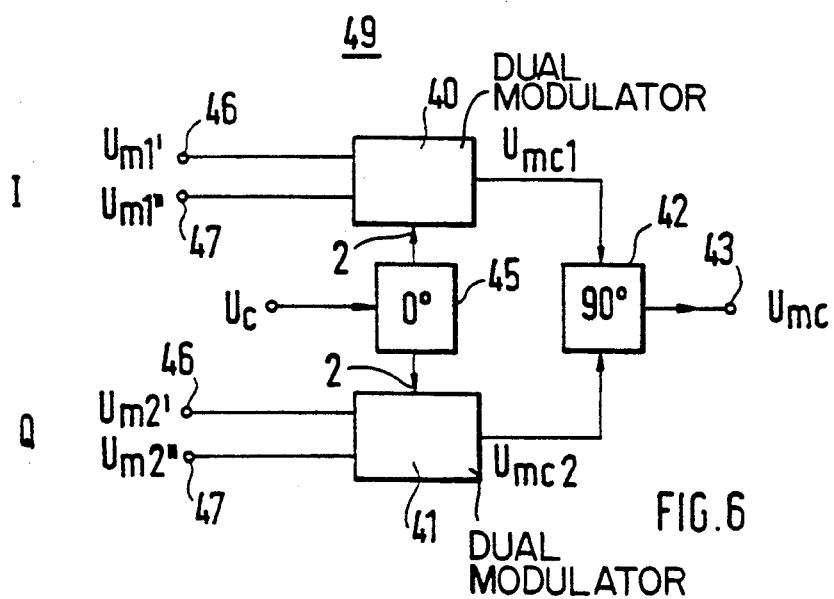

FIG. 6 shows a prior art schematic for a 16 QAM-modulator 49 (Quadratic Amplitude Modulation) for a bit sequence frequency of 140 Mbit/sec. It essentially consists of two dual modulator stages 40, 41, whereby the one dual modulator stage 40 provides the signal for the I-component, and the other dual modulator stage 41 the signal for the Q-component. In the power combiner 42 the two components are orthogonally combined.

The output 43 of the power combiner 42 constitutes the output for the 16 QAM-modulator 49. The carrier U is applied at the carrier inputs of the two modulator stages 40, 41 via a so-called Wilkinson coupler 45. The modulator signals for the I or Q components are applied respectively to the signal inputs 46, 47 of the two dual modulator stages 40, 41, whereby a modulation signal $U_m$ of an equal amplitude, but opposite sign is applied at each dual modulator stage 40, 41 for the I or Q component.

Particularly suitable as semiconductor diodes $D_1'$, $D_1"$, $D_2'$, $D_2"$ are Schottky diodes, which, for example, have shorter delay times than PIN diodes. The temperature dependence of the diodes is compensated by arranging in pairs in the bridge circuit. Manufacture-based differences of the diodes can be, for example, compensated by application of a dc voltage via the regulable resistor at the signal input, thus optimizing the carrier suppression. The regulable resistors $R_R'$, $R_R"$ are in each case set so that when the modulation voltage $U_m$ is not applied in each partial modulator stage 1', 1", a balanced condition prevails in the bridge 70.

The described modulator stage 1 can also be operated as a transmission or a receiving mixing stage (not shown). The use of the modulator stage 1 of the first embodiment as a transmission mixer stage will be considered as an example. The signal inputs 4' and 4" described in the first embodiment, are designated for the input of the signal whose frequency is to be converted. If the polarity of the diode pair $D_1'$, $D_2'$ relative to the carrier input 2 corresponds (as shown in FIG. 4) to that of the diode pair $D_1"$, $D_2"$, the signal to be frequency-converted must be inverted at one of the two signal inputs. If, on the other hand, the polarity of the diode pair $D_1'$, $D_2'$ relative to the carrier input 2" does not correspond to that of the diode pair $D_1"$, $D_2"$, the two signal inputs can be directly connected to each other.

The same is also true for the application of the 16 QAM modulator 49 as a mixer which can be operated on the reception side as a mirror-image frequency suppressing mixer and on the transmission side as a single-sideband mixer. Of course, when so utilizing both coupling branches I and Q, it is necessary to connect them via a 90° power combiner.

The use of a modulator stage as a mixer stage is known in principle and therefore needs no further explanation.

What is claimed is:

1. Modulator stage for forming a modulated carrier signal from a carrier and a digital modulating signal and comprising: a carrier input, a signal input, a signal output, an electrically short path leading from the carrier input to the signal output, a phase delay path also leading from the carrier input to the signal output, a low-pass filter for shifting the phase of the carrier in the phase delay path by about 180° or an odd integral multiple thereof with respect to the phase of the carrier in the electrically short path, first and second nonlinear semiconductor devices having respective opposite polarities with respect to the direction of propagation of the carrier and arranged in the two paths in such a way as to be operable in phase with respect to the carrier, and means for connecting the signal input to the phase delay path such that the modulator stage operates in push-pull fashion with respect to the signal.

2. A modulator stage as claimed in claim 1, wherein the low-pass filter consists of an odd number of elements, and that an inductance is located at each end of the phase delay path.

3. A modulator stage as claimed in claim 2, wherein the low-pass filter consists of three series-connected inductances between each of which a capacitance is coupled to ground.

4. A modulator stage as claimed in claim 1, wherein the cutoff frequency of the low-pass filter is approximately equal to the 2nd harmonic of the carrier frequency.

5. A modulator stage as claimed in claim 1 implemented as a monolithic microwave integrated circuit.

6. A modulator stage as claimed in claim 1 implemented at least predominantly using microstrip technology.

7. A double modulator stage comprising two partial modulator stages as claimed in claim 1, wherein the two carrier inputs and the two signal outputs of the two partial modulator stages are respectively connected together, signals of equal magnitude but opposite sign are applied to the signal inputs of the two partial modulator stages, and the double modulator stage further comprises scalar addition means for performing scalar addition of the modulated antiphase carrier voltages of the partial modulator stages.

8. A modulator stage as claimed in claim 7, wherein the scalar addition means is a 180° coupler interposed between the outputs of the partial modulator stages and the output of the double modulator stage.

9. A modulator stage as claimed in claim 7, wherein the signal input of each of the partial modulator stages has a variable resistor associated therewith for trimming the respective modulator stage.

10. A modulator stage as claimed in claim 1, wherein each of the nonlinear semiconductor devices is a Schottky diode.

* * * * *